(12) United States Patent
Hortig et al.

(10) Patent No.: US 8,618,425 B2
(45) Date of Patent: Dec. 31, 2013

(54) SENSOR MODULE HAVING AN ELECTROMAGNETICALLY SHIELDED ELECTRICAL COMPONENT

(75) Inventors: Michael Hortig, Eningen u.A. (DE); Peter Kunert, Lichtenstein (DE)

(73) Assignee: Robert Bosch GmbH, Stuttgart (DE)

( * ) Notice: Subject to any disclaimer, the term of this patent is extended or adjusted under 35 U.S.C. 154(b) by 288 days.

(21) Appl. No.: 13/195,543

(22) Filed: Aug. 1, 2011

(65) Prior Publication Data

US 2012/0031662 A1 Feb. 9, 2012

(30) Foreign Application Priority Data

Aug. 9, 2010 (DE) .......................... 10 2010 039 063

(51) Int. Cl.
*H05K 9/00* (2006.01)
*H05K 13/04* (2006.01)
(52) U.S. Cl.
USPC .......................................... 174/377; 29/825
(58) Field of Classification Search
CPC .................................. H05K 9/00; H05K 13/04
USPC ........................................... 174/377; 29/825
See application file for complete search history.

(56) References Cited

U.S. PATENT DOCUMENTS

2009/0027861 A1  1/2009  Ohl et al.

FOREIGN PATENT DOCUMENTS

DE     102007031562     1/2009

*Primary Examiner* — Timothy Thompson
*Assistant Examiner* — Charles Pizzuto
(74) *Attorney, Agent, or Firm* — Kenyon & Kenyon LLP

(57) ABSTRACT

In a module having an electrical component, which is situated between two ground planes for electromagnetic shielding, a trough-shaped composite component is provided between an inner and an outer housing, into which the rear side of the inner housing is inserted, the composite component having an insulator trough and, on its inside, a ground plane formed at least on the trough bottom, which forms the shielding of a rear side of the electrical component. The composite component is advantageously designed as an MID component. The outer housing of the module may be manufactured in the two-component injection molding process by extrusion-coating initially using an elastomer and subsequently a thermoplast.

9 Claims, 4 Drawing Sheets

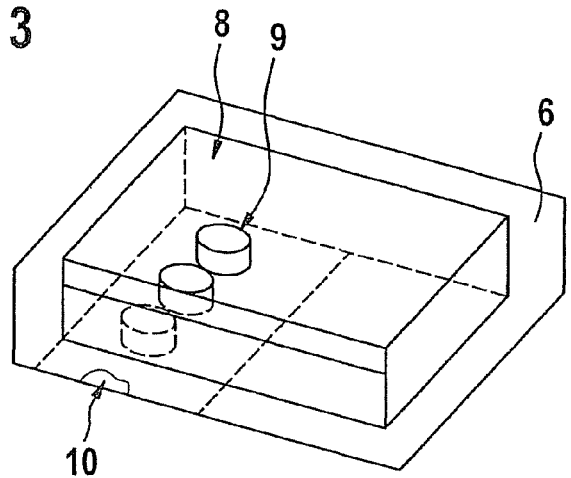
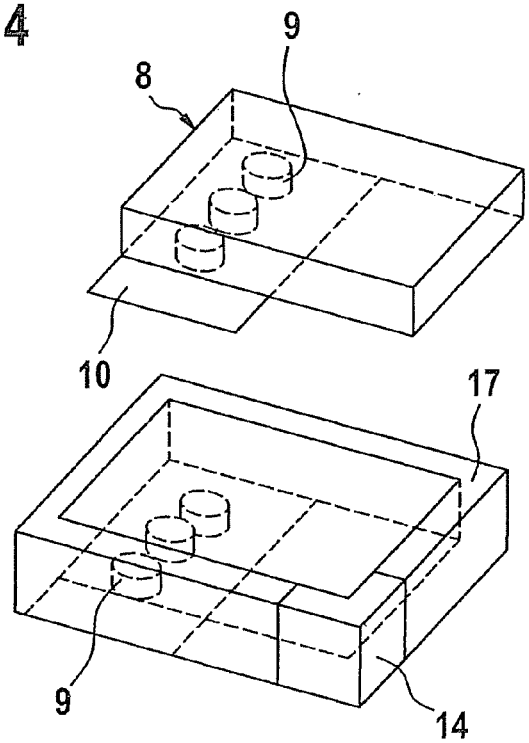

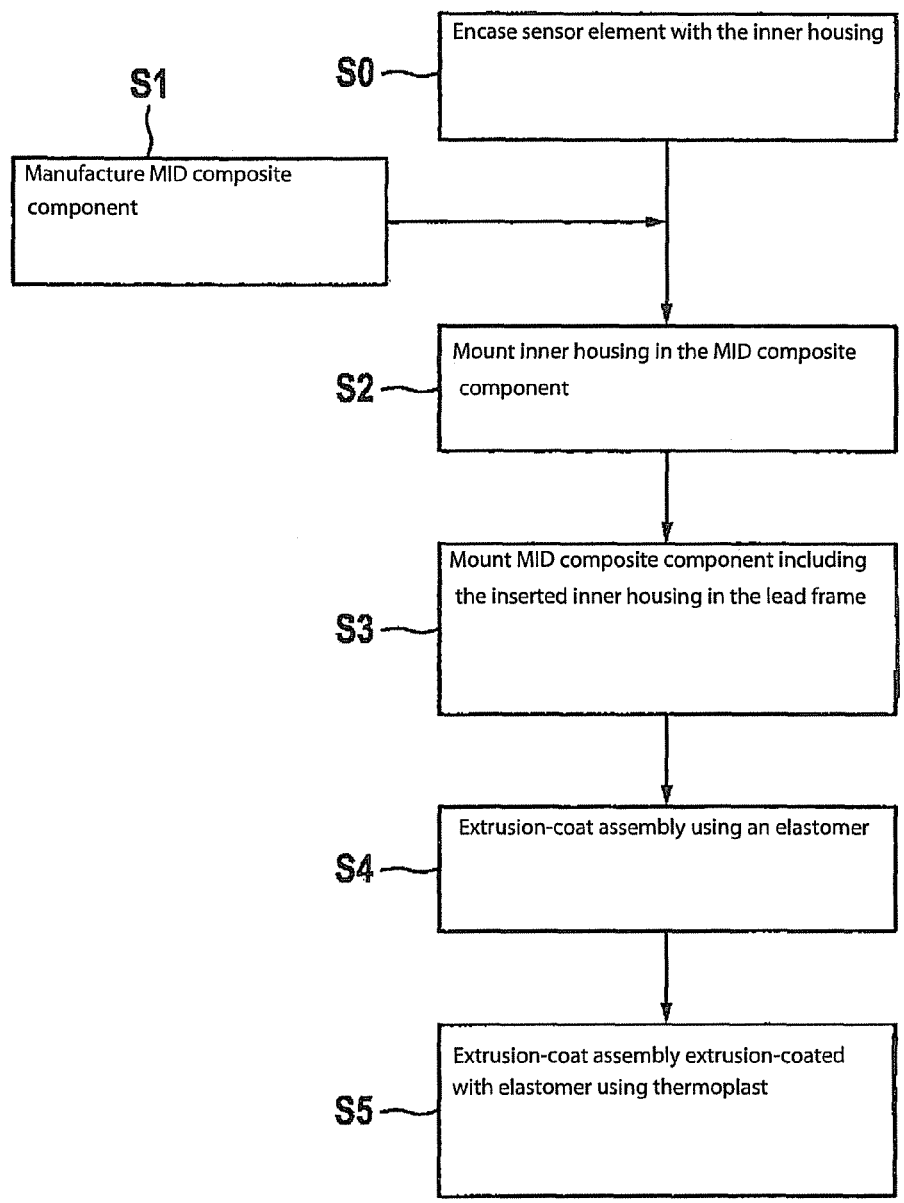

SENSOR MODULE HAVING AN ELECTROMAGNETICALLY SHIELDED ELECTRICAL COMPONENT

CROSS REFERENCE

The present application claims the benefit under 35 U.S.C. §119 of German Patent Application No. DE 102010039063.1, filed Aug. 9, 2011, which is expressly incorporated herein by reference in its entirety.

FIELD OF THE INVENTION

The present invention relates to a module having an electrical component, an inner housing, which surrounds the electrical component, and has a front side and a rear side, an outer housing in whose interior the inner housing is situated, and first and second large-area ground planes for electromagnetically shielding the electrical component, which are situated opposite each other, and the electrical component being situated between the two ground planes. The present invention furthermore relates to a method for manufacturing such a module.

BACKGROUND INFORMATION

A generic module is described, for example, in German Patent Application No. DE 10 2007 031 562 A1. Modules of this type are used in particular as sensor modules, for example for peripheral acceleration sensors in motor vehicles.

In the conventional sensor modules, the EMC protection of the electronic components is achieved via a shielding between two ground planes. The lower ground plane is formed, for example, by the GND layer on a printed circuit board or without a printed circuit board, by a flat part of a terminal pin of the module, while the upper ground plane is formed by the pressed screen of the sensor IC (inverted lead frame).

In future airbag sensors the electronic system should be contacted in a separate manufacturing station using metallic insert parts (lead frame), which, at the same time, form the plug-in contacts of the module. The assembly: electronics plus insert parts should be enclosed using an elastomer shell and then extrusion-coated using a thermoplast. The outer housing of the module is manufactured by extrusion-coating using a first and a second component in a special two-component injection molding tool to ensure a continuous manufacturing process. However, in this "2C direct extrusion-coating" process, a ground shielding of the conventional type, i.e., using large ground planes, cannot be implemented, since only narrow metallic insert parts are processable in the injection molding tool, so that sensitivity to EMC interference would be higher. Furthermore, metal coating of all sides of the housed sensor chip (EMC coating) is not suitable for automotive applications according to the current state of the art because it results in a short-circuit between the plug pins.

SUMMARY

In an example module according to the present invention, in addition to the generic features, a trough-shaped composite component is provided between the inner and the outer housing, in which the rear side of the inner housing is inserted, the composite component having an insulator trough and, on its inside, a ground plane formed at least on the trough bottom, which forms the shielding of a rear side of the electrical component.

According to the example embodiment of the present invention, this provides an effective and robust EMC shielding for modules, in particular sensor modules. By producing conductive areas on the inside of the trough-shaped composite component, a complete ground cage may be formed around the electrical component without producing a short-circuit on the lead frame.

According to a specific embodiment of the present invention considered to be particularly advantageous, the composite component is designed as an MID (molded interconnect device), so that the ground plane is implemented with the aid of a generally conventional method by metal plating the insulator trough on its inside.

According to another advantageous specific embodiment, the outer housing has electrical contact arrangement, which extend from the inside to at least one external side of the outer housing, at least one part of the contact arrangement being situated on the external wall of the trough bottom of the composite component. This specific embodiment opens simple options, in particular for the electrical connection between the inside metal plating of the MID component and the electrical contact means situated on the external wall of the trough bottom of the MID component, for example with the aid of throughplating to be provided in the trough bottom of the composite component. Alternatively or additionally, the electrical connection may be implemented by at least one printed conductor guided over the trough edge and/or with the aid of a soldering joint.

The present invention also relates to a method for manufacturing a module of the above-named type in which the rear side of the inner housing is inserted into the trough-shaped composite component, then the composite component having the inserted inner housing is mounted in a lead frame for contacting the electrical component, and in which the assembly made up of the composite component, lead frame, and inner housing having the electrical component is then extrusion-coated for producing the outer housing. The actual sensor element (inner housing having the electrical component) thus advantageously does not need to be subjected to additional processes during its manufacture. The composite component, for example an MID component, may also be manufactured independently from the manufacture of the sensor element in the usual manufacturing processes.

A refinement of the above-described manufacturing process may be particularly advantageous if, for manufacturing of the outer housing in a two-component injection molding process, the assembly made up of the composite component, lead frame and inner housing having the electrical component is initially extrusion-coated using an elastomer and subsequently by a thermoplast. Despite the large-surface ground shielding (inside metal coating 8), the manufacture of outer housing 5 in the 2-step method, which is generally conventional, is advantageously possible.

BRIEF DESCRIPTION OF THE DRAWINGS

The present invention is described below in greater detail with reference to exemplary embodiments.

FIG. 3 shows a perspective view of the MID component of the module according to FIGS. 1 and 2.

FIG. 4 shows an exploded view of the MID component according to FIG. 3.

FIG. 6 shows a flow chart for illustrating the method for manufacturing the module according to the present invention.

DETAILED DESCRIPTION OF EXAMPLE EMBODIMENTS

Figure 1:
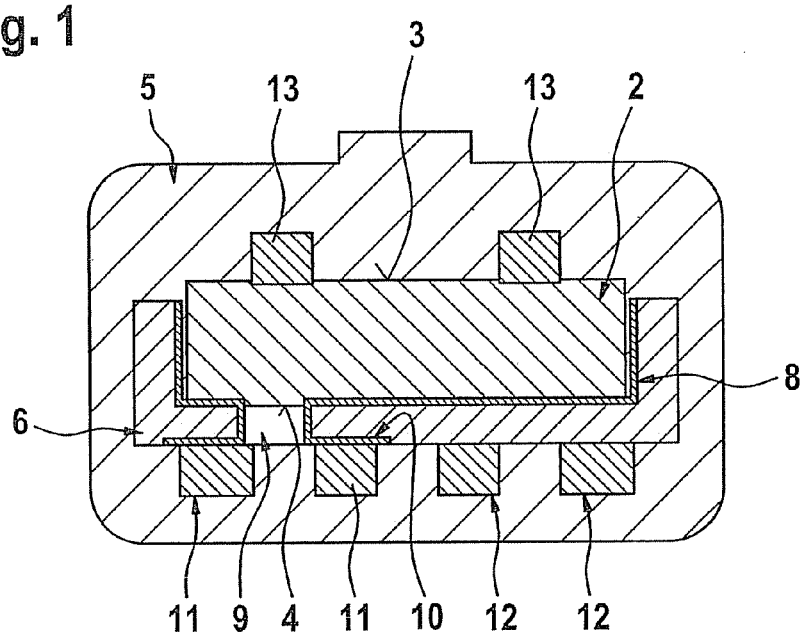
FIG. 1 shows a sectioned view of a module according to the present invention having an MID composite component.
Figure 2:
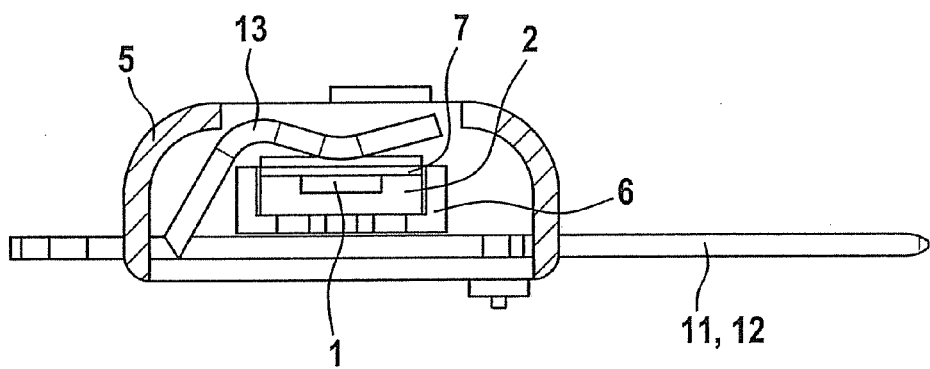
FIG. 2 shows a side view of the module according to FIG. 1.

FIG. 1 shows a module according to the present invention in which initially an inner housing 2 is visible, which has a front side 3 and a rear side 4. Rear side 4 of inner housing 2 is inserted into a trough-shaped MID component 6. Electrical component 1 (not illustrated here, see FIG. 2) is situated in inner housing 2 in such a way that the front side of electrical component 1 is oriented toward front side 3 of inner housing 2. In the area of front side 3 of inner housing 2 a first ground plane 7 is situated (see FIG. 2), which is used for electromagnetically shielding the front side of electrical component 1. To shield the other sides of electrical component 1, in particular its rear side, the inside, i.e., internal wall, of MID component 6 is provided with a contiguous metal plating 8, which is used as a ground plane. With the aid of throughplating 9, an electrical connection is established between inside metal plating 8 and a locally limited metal plating 10 on the external wall of the trough bottom of MID component 6. In this way, an electrical connection between inside metal plating 8 and ground terminals 11 of the module is produced, while, on the other hand, no electrical contact exists between inside metal plating 8 and signal terminals 12 of the module. The assembly made up of the lead frame, including insert parts 11, 12, and 13, inner housing 2 having electrical component 1, and MID composite component 6 is provided with an outer housing 5 with the aid of an injection molding process as shown in FIG. 1. The actual sensor element may have, in addition to sensor chip 1 and inner housing 2, also an (organic) laminate as a carrier substrate having metallic printed conductors (LGA).

FIG. 3 shows a perspective view onto composite component 6; composite component 6 in FIG. 4 is shown in an exploded view, separated into its two components for better understanding. The upper part of FIG. 4 shows inside metal plating 8, partial metal plating 10 provided for the outside of the trough bottom, and throughplatings 9 electrically connecting these two metal platings. In contrast, the bottom part of FIG. 4 shows insulator trough 17 of composite component 6. In addition, in this part of FIG. 4, a wide printed conductor 14 is drawn over the edge of insulator trough 17, which implements an additional electrical connection option between inside metal plating 8 and ground terminals 11 of the module.

Figure 5:
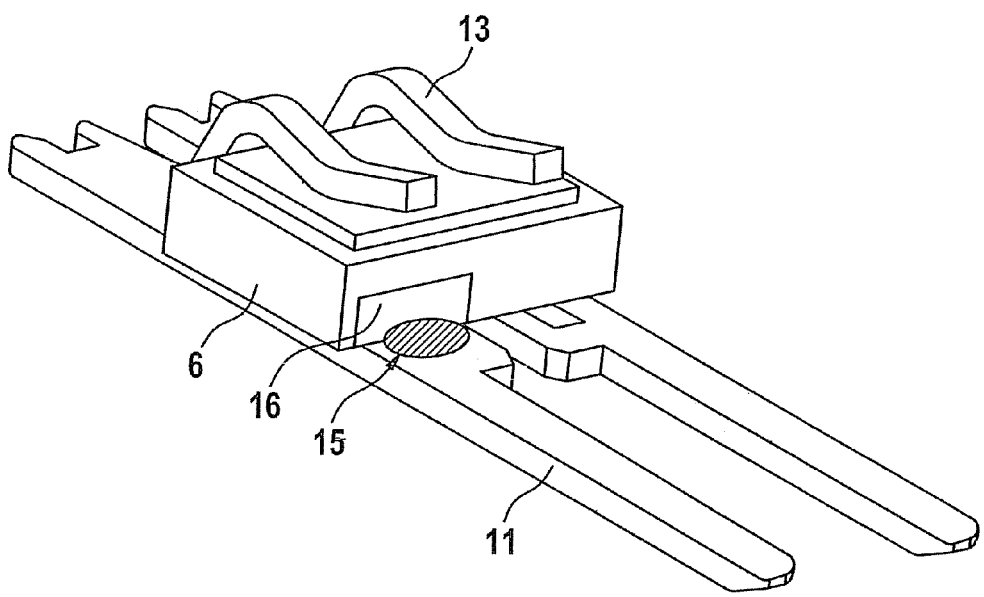
FIG. 5 shows a perspective view of an embodiment variant of the module according to the present invention, but still without an outer housing.

FIG. 5 shows that on the external wall of MID component 6, outside the trough bottom, a partial metal plating 16 is formed, which is electrically connected to inside metal plating 8, and that this partial metal plating 16 is electrically connected to ground pins 11 with the aid of a soldered joint 15. In this way, the conductivity and reliability of the connection from GND pin 11 to inside metal plating 8 increases. This step may be implemented simultaneously with the solder connection between the sensor element (LGA) 2,1 and insert part 11, 12, and 13, the additional manufacturing effort (dispensing soldering paste on contact point 15) being negligibly small (only additional travel of the dispensing needle).

In sensors having a two-wire interface, a plug pin 11 forms the additional GND connection. It may thus be tapped in a targeted manner, as described above, and used for shielding sensor elements 2 and 1.

FIG. 6 shows a flow chart for illustrating the example method for manufacturing the module. In method step S0, pre-manufactured sensor elements 1, 2, i.e., the LGA, are encased by inner housing 2 via an injection molding process. Independently of this step, in method step S1, selectively metal plated composite component 6, for example an MID component, is produced. The conventional methods of selectively metal plating plastic component 6, for example a two-component injection molding process, may be used here. In method step S2, rear side 4 of inner housing 2 is subsequently inserted into trough-shaped composite component 6. Assembly of composite component 6 is therefore very easy.

In the following method step S3, composite component 6, including inserted inner housing 2, is mounted into a lead frame 11, 12, 13 for contacting electrical component 1.

The manufacturing of outer housing 5 of the module advantageously proceeds in such a way that the previously mounted assembly of composite component 6, lead frame 11, 12, 13, and inner housing 2 having electrical component 1 is extrusion-coated in method step S4, using the conventional two-component injection molding process, initially using an elastomer, and subsequently, in method step S5, using a thermoplast.

What is claimed is:

1. A module having an electrical component, comprising:
   an inner housing which surrounds the electrical component and has a front side and a rear side;
   an outer housing in whose interior the inner housing is situated;
   first and second ground planes to electromagnetically shield the electrical component, which are situated opposite each other, the electrical component being situated between the first and second ground planes; and
   a trough-shaped composite component situated between the inner housing and the outer housing, into which the rear side of the inner housing is inserted, the composite component having an insulator trough and, on its inside, a ground plane formed at least on a bottom of the insulator trough, which forms the shielding of a rear side of the electrical component.

2. The module as recited in claim 1, wherein the trough-shaped composite component is an MID component, the ground plane being designed as an inside metal plating.

3. The module as recited in claim 2, wherein the outer housing has an electrical contact arrangement which extends from an inside of the outer housing to at least one external side of the outer housing, at least one part of a contact arrangement being situated on an external wall of the trough bottom of the composite component.

4. The module as recited claim 3, wherein in the trough bottom of the MID component, at least one throughplating is provided for electrically connecting an inside metal plating of the MID component to the electrical contact arrangement situated on the external wall of the trough bottom of the MID component.

5. The module as recited in claim 4, wherein the external wall of the trough bottom of the MID component is partially metal plated, in the area of the throughplating.

6. The module as recited in claim 4, wherein at least one printed conductor guided over an edge of the trough edge is provided for electrically connecting the inside metal plating of the MID component to the electrical contact arrangement situated on the external wall of the trough bottom of the MID component.

7. The module as recited in claim 4, wherein a partial metal plating is formed on the external wall of the MID component outside the trough bottom and is electrically connected to the inside metal plating, and the partial metal plating is electrically connected to the electrical contact arrangement using a soldered joint.

8. The module as recited in claim 3, wherein the electrical contact arrangement is designed as a lead frame, and the MID component is clamped between the lead frame and the inner housing.

9. The module as recited in claim 8, wherein the module is a sensor module, and the electrical component is a micromechanical sensor.

\* \* \* \* \*